United States Patent
Lee et al.

(10) Patent No.: US 9,711,754 B2
(45) Date of Patent: Jul. 18, 2017

(54) MANUFACTURING METHOD OF DISPLAY DEVICE

(71) Applicant: Samsung Display Co., Ltd., Yongin-si, Gyeonggi-do (KR)

(72) Inventors: Hoi Kwan Lee, Anseong-si (KR); Seung Kim, Seongnam-si (KR); Seung Ho Kim, Asan-si (KR); Cheol Min Park, Suwon-si (KR); Eun-Kyung Yeon, Suwon-si (KR); In Sun Hwang, Suwon-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/927,045

(22) Filed: Oct. 29, 2015

(65) Prior Publication Data
US 2016/0320643 A1 Nov. 3, 2016

(30) Foreign Application Priority Data

Apr. 29, 2015 (KR) .................. 10-2015-0060899

(51) Int. Cl.
*H01L 51/52* (2006.01)
*H01L 51/56* (2006.01)
*G02F 1/1333* (2006.01)
*G02F 1/1339* (2006.01)

(52) U.S. Cl.
CPC .... *H01L 51/5237* (2013.01); *G02F 1/133351* (2013.01); *H01L 51/5246* (2013.01); *H01L 51/56* (2013.01); *G02F 1/1339* (2013.01); *G02F 2001/133354* (2013.01); *H01L 2251/5338* (2013.01); *H01L 2251/566* (2013.01)

(58) Field of Classification Search
CPC ............. G02F 1/1333; G02F 1/133351; G02F 1/1339; G02F 1/13354; H01L 51/5237; H01L 51/5246; H01L 51/56
See application file for complete search history.

(56) References Cited

U.S. PATENT DOCUMENTS 7,273,403 B2 * 9/2007 Yokota .................. G02F 1/1333
349/187

FOREIGN PATENT DOCUMENTS

| KR | 10-2012-0053191 A | 5/2012 |
|---|---|---|
| KR | 10-1298236 A | 8/2013 |
| KR | 10-2013-0127173 A | 11/2013 |
| KR | 10-2013-0139664 A | 12/2013 |
| KR | 10-2014-0067557 A | 6/2014 |
| KR | 10-2014-0109016 A | 9/2014 |

* cited by examiner

*Primary Examiner* — Anne Hines
(74) *Attorney, Agent, or Firm* — Innovation Counsel LLP

(57) ABSTRACT

An exemplary embodiment provides a manufacturing method of a display device, including: preparing a first panel and a second panel that are respectively provided with one or more pattern layers formed on a substrate; bonding the first panel and the second panel; cutting the bonded panel into division panels of a cell unit; chamfering the division panels; and chemical reinforcing the chamfered division panels.

9 Claims, 12 Drawing Sheets

MANUFACTURING METHOD OF DISPLAY DEVICE

RELATED APPLICATIONS

This application claims priority to and the benefit of Korean Patent Application No. 10-2015-0060899 filed in the Korean Intellectual Property Office on Apr. 29, 2015, the entire contents of which are incorporated herein by reference.

BACKGROUND

1. Field

The described technology relates generally to a manufacturing method of a display device that has excellent durability and reliability.

2. Description of the Related Art

Recently, liquid crystal displays (LCD) and organic light emitting displays (OLED) are the most commonly used display devices.

An LCD displays images by applying voltages to field-generating electrodes to generate an electric field in a liquid crystal (LC) layer that determines the orientations of LC molecules therein to adjust polarization of incident light thereto. Differently from an LCD, an OLED has a self-light emitting characteristic, does not require a separate light source, and displays an image through a display substrate in which a thin film transistor and an organic light emitting element are formed.

Recently, display devices are becoming larger and are also being developed as a curved type to enhance immersion and be more realistic to viewers. By applying external force to a flat liquid crystal display panel, a curved display device is manufactured to have a constant curvature.

A display device generally includes an array panel, a touch screen panel, a cover window, or the like, that are formed of glass. In a manufacturing process of the display device, a mother panel is cut into unit cell panels, and each cut cell panel is shaped to fit to an item to be applied. In this case, there are many micro-cracks on an incision surface of a glass panel caused by the cutting.

Further, in the case of the curved display device, a curved panel is formed by friction between a flat panel and a wheel rotating at a high speed, which causes micro-cracks to further occur on a surface of the flat glass panel. As a result, flaws extending in a direction perpendicular to the surface of the flat glass panel are formed.

As such, since the micro-cracks occur in the manufacturing process of the display device, the durability and reliability of the display panel deteriorates. Thus, a method of controlling the micro-cracks occurring in the manufacturing process is required.

The above information disclosed in this Background section is only to enhance the understanding of the background of the described technology and therefore may contain information that does not form the prior art that is already known in this country to a person of ordinary skill in the art.

SUMMARY

The described technology provides a manufacturing method of a display device that has excellent durability and reliability achieved through a chemical reinforcing process.

An exemplary embodiment provides a manufacturing method of a display device, including: preparing a first panel and a second panel that are respectively provided with one or more pattern layers formed on a substrate; bonding the first panel and the second panel; cutting the bonded panel into division panels of a cell unit; chamfering the division panels; and chemical reinforcing the chamfered division panels.

The division panels may include a first division panel and a second division panel that are bonded to each other, and the first division panel may include a cover area that is covered by the second division panel and an exposure area other than the covered area.

Pad electrodes may be formed on an upper portion of the first division panel belonging to the exposure area.

The manufacturing method of the display device may further include coating a first passivation layer to cover the exposure area of the first division panel before the chamfering.

The first passivation layer, in the coating of the first passivation layer, may extend to cover at least a portion of the second division panel adjacent to the exposure area.

An end portion of the first division panel belonging to the exposure area, in the chamfering, may be chamfered.

The manufacturing method of the display device may further include coating a second passivation layer on portions other than the chamfered portion of the first division panel belonging to the exposure area before the chemical reinforcing.

The chemical reinforcing may include a healing process dipping the division panel in an etchant to be chemically reinforced.

The first panel and the second panel may be bent to have the same curvature.

The first division panel and the second division panel may be bent to have the same curvature before the chamfering.

According to an exemplary embodiment, it is possible to manufacture a display device that has excellent durability and reliability by effectively controlling micro-cracks generated inside a glass substrate in a step of cutting a bonded panel, a step of chamfering the cut surface of the bonded panel, and a step of bending the bonded panel, through a chemical reinforcing process.

BRIEF DESCRIPTION OF THE DRAWINGS

FIG. 7A illustrates a micro-structure of the surface of the glass substrate surface before the chemical reinforcing, and FIG. 7B illustrates a micro-structure of the surface of the glass substrate surface after the chemical reinforcing.

DETAILED DESCRIPTION

Figure 1:
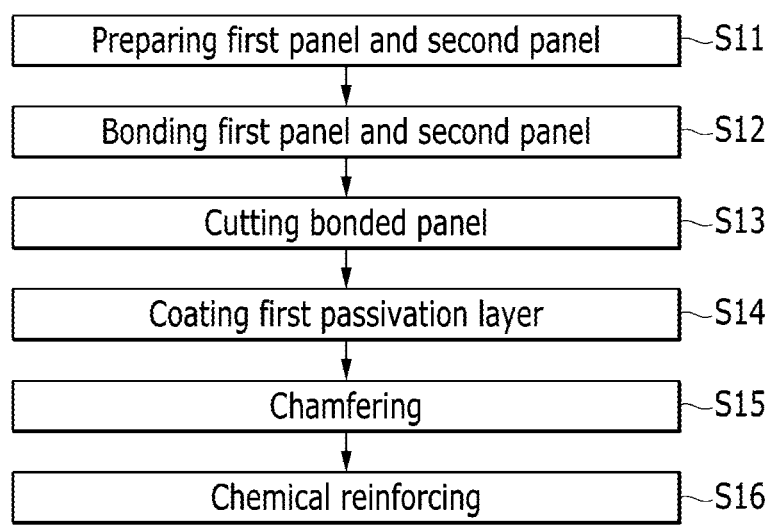
FIG. 1 is a flowchart of a manufacturing method of a display device according to a first exemplary embodiment.

Hereinafter, exemplary embodiments are described in detail with reference to the attached drawings such that the described technology can be easily put into practice by those skilled in the art. As those skilled in the art would realize, the described embodiments may be modified in various different ways, all without departing from the spirit or scope of the described technology. The drawings and description are illustrative in nature and not restrictive. Like reference numerals designate like elements throughout the specification.

Further, in various exemplary embodiments, since like reference numerals designate like elements having the same configuration, a first exemplary embodiment is representatively described, and in other exemplary embodiments, only different configurations from the first exemplary embodiment are described.

Parts that are irrelevant to the description are omitted to more clearly express the described technology. The same or similar constituent elements are designated by the same reference numerals throughout the specification.

Throughout this specification and the claims that follow, when an element is described as being "coupled" to another element, the element may be "directly coupled" to the other element or "electrically coupled" to the other element through a third element. In addition, unless explicitly described to the contrary, the word "comprise" and its variations, such as "comprises" or "comprising", imply the inclusion of stated elements but not the exclusion of any other elements.

In the drawings, the thickness of layers, films, panels, regions, etc., are exaggerated for clarity. Like reference numerals designate like elements throughout the specification. When an element such as a layer, film, region, or substrate is referred to as being "on" another element, it may be directly on the other element, or intervening elements may also be present. In contrast, when an element is referred to as being "directly on" another element, there are no intervening elements present.

A manufacturing method of a display device according to a first exemplary embodiment is described with reference to FIGS. 1 to 6, 7A, 7B, and 8.

FIG. 1 is a flowchart of a manufacturing method of a display device according to a first exemplary embodiment.

A manufacturing method of a display device according to a first exemplary embodiment includes preparing a first panel and a second panel that are respectively provided with one or more pattern layers formed on a substrate (S11); bonding the first panel and the second panel (S12); cutting the bonded panel into division panels of a cell unit (S13); coating a first passivation layer (S14); chamfering the division panels (S15); and chemical reinforcing the chamfered division panels (S16).

Figure 2:
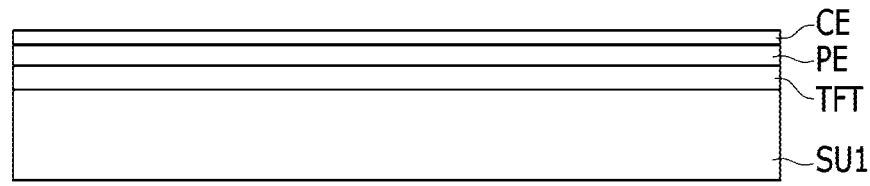
FIG. 2 is a schematic diagram of a first panel in which a pattern layer is formed according to a first exemplary embodiment.
Figure 3:
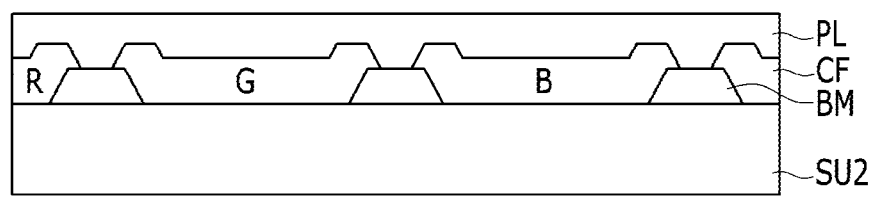
FIG. 3 is a schematic diagram of a second panel in which a pattern layer is formed according to a first exemplary embodiment.

FIG. 2 is a schematic diagram of a first panel in which a pattern layer is formed according to a first exemplary embodiment. FIG. 3 is a schematic diagram of a second panel in which a pattern layer is formed according to a first exemplary embodiment.

In the preparation of the first panel and the second panel (S11), the first panel PN1 and the second panel PN2, of which one or more pattern layers are formed on the substrate thereof, are respectively prepared. In the present exemplary embodiment, the substrates respectively disposed on bases of the first panel PN1 and the second panel PN2 may be formed of glass.

As shown in FIG. 2, the first panel PN1 may be a laminated body in which pattern layers, such as a thin film transistor array (TFT) layer, a pixel electrode (PE), and a common electrode (CE), are sequentially laminated on a first glass substrate SU1.

The first glass substrate SU1 is an insulation substrate that has a flat shape. The first glass substrate SU1 may be formed to have a thickness of about 0.5 T (0.5 mm) to 0.7 T (0.7 mm). However, the thickness of the first glass substrate SU1 is not limited thereto, and it may be changed according to a kind of manufactured panel, specific composition of the glass, and the like. For example, when a panel that is slimmer than the thickness of about 0.5 T (0.5 mm) to 0.7 T (0.7 mm) is to be formed, the first glass substrate SU1 may be formed to have a thickness of about 0.1 T (0.1 mm).

The thin film transistor array (TFT) layer includes a plurality of thin film transistors (not shown) that are disposed in a matrix form on the first glass substrate SU1.

The pixel electrode (PE) may be made of a transparent conductive inorganic material such as an indium tin oxide (ITO) or an indium zinc oxide (IZO).

The common electrode (CE) is made of a transparent conductive inorganic material such as an indium tin oxide (ITO) or an indium zinc oxide (IZO) on the pixel electrode (PE), and it has uniform thickness. However, the position of the common electrode (CE) is not limited thereto, and it may be laminated on a lower portion of the pixel electrode (PE) or the top of the second panel PN2 according to operation or a design thereof.

As shown in FIG. 3, the second panel PN2 may be a laminated body in which pattern layers, such as light blocking layers (BM), a color filter layer (CF), and a passivation layer (PL), may be sequentially laminated on a second glass substrate SU2.

The second glass substrate SU2 is a flat-shaped insulation substrate, like the first glass substrate SU1.

The light blocking layers (BM) are provided between red (R), green (G) and blue (B) color pixels, and divide areas where the color pixels are formed, thereby improving color reproducibility of the color pixels.

The color filter layer (CF) is configured by the red (R), green (G) and blue (B) color pixels, and is disposed to cover the second glass substrate SU2 and a portion of each of the light blocking layers (BM).

The passivation layer (PL) is provided on the color filter layer (CF) and the light blocking layer (BM) to form a flat upper portion of the second panel PN2, thereby preventing unevenness of a step generated in an overlapping area between the light blocking layer (BM) and the color pixels.

In the first exemplary embodiment, since the second panel PN2 includes the color filter layer (CF) and the light blocking layer (BM), as shown in FIG. 3, a liquid crystal display may be manufactured by injecting liquid crystal between the first panel PN1 and the second panel PN2 after bonding the first and second panels PN1 and PN2.

However, the scope of the described technology is not limited thereto. For example, instead of an LCD, an organic light emitting device may be manufactured through bonding of the first panel PN1 and the second panel PN2, after forming a display panel, by further laminating an organic light emitting element (not shown) on the first panel PN1 and, after forming an encapsulation panel, by laminating a functional layer (not shown) and a moisture barrier layer (not shown) on the second glass substrate SU2 of the second panel PN2, instead of the color filter layer (CF), the light blocking layer (BM), and the passivation layer (PL).

In the first exemplary embodiment, the first panel PN1 and the second panel PN2 may be formed to have the same size as the mother panel. Accordingly, the whole manufacturing process of the display device may be shortened, and the display device may be easily mass-produced.

In the bonding of the first panel and the second panel (S12), the second panel PN2 is positioned and bonded on the first panel PN1 such that the second glass substrate SU2 is positioned on the top of the bonded panel. That is, the second panel PN2 of FIG. 3 may be reversely disposed.

In the case of an LCD, the first panel PN1 and the second panel PN2 may be disposed to be spaced apart from each other so that liquid crystal may be injected between the first panel PN1 and the second panel PN2 by a subsequent process.

Figure 4:
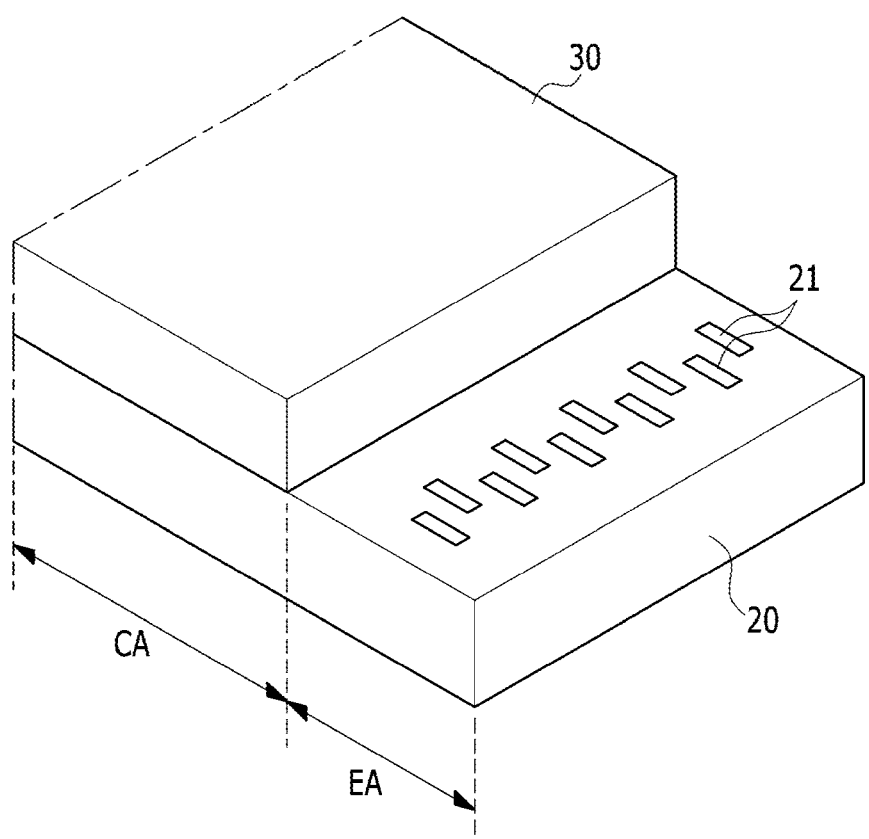
FIG. 4 is a schematic perspective view illustrating a division panel in a manufacturing method of a display device according to a first exemplary embodiment.

FIG. 4 is a schematic perspective view illustrating a division panel in a manufacturing method of a display device according to a first exemplary embodiment.

In the cutting of the bonded panel (S13), the bonded panel in which the first panel PN1 and the second panel PN2 having the size of the mother panel are bonded to each other is cut into division panels of a cell unit size so that each cell unit becomes a separate display unit.

A process of cutting the bonded panel may include a scribing process and a breaking process. Since specific cutting processes thereof are already known, a detailed description thereof is omitted.

The cut division panel, as shown in FIG. 4, includes a first division panel 20 cut from the first panel PN1 and a second division panel 30 cut from the second panel PN2.

Only a portion of the first division panel 20 is bonded to the second division panel 30. That is, one portion of the first division panel 20, as shown in FIG. 4, may not be covered by the second division panel 30 and may be exposed.

In the present exemplary embodiment, an area of the first division panel 20 that is covered by the second division panel 30 is defined as a cover area (CA), and an area of the first division panel 20 that is not covered by the second division panel 30 so as to be exposed is defined as an exposure area (EA).

In the first division panel 20 belonging to the cover area (CA), a thin film transistor array layer (TFT), a pixel electrode (PE), and a common electrode (CE), such as those pattern layers formed on the first panel PN1 of FIG. 2, may be sequentially laminated on a glass substrate, such the first glass substrate SU1 of FIG. 2.

In the first division panel 20 belonging to the exposure area (EA), pad electrodes 21 are formed on the glass substrate, such as the first glass substrate SU1 of FIG. 2. The pad electrodes 21 may be electrically connected to the thin film transistor array layer (TFT), the pixel electrode (PE), and the common electrode (CE). The pad electrode 21 is connected to an external driver (not shown), which controls an image displayed on the display device.

Because the end portions of the first division panel 20 belonging to the exposure area (EA) are formed by cutting the first panel PN1 into cell units, micro-cracks occur at these end portions.

Figure 5:
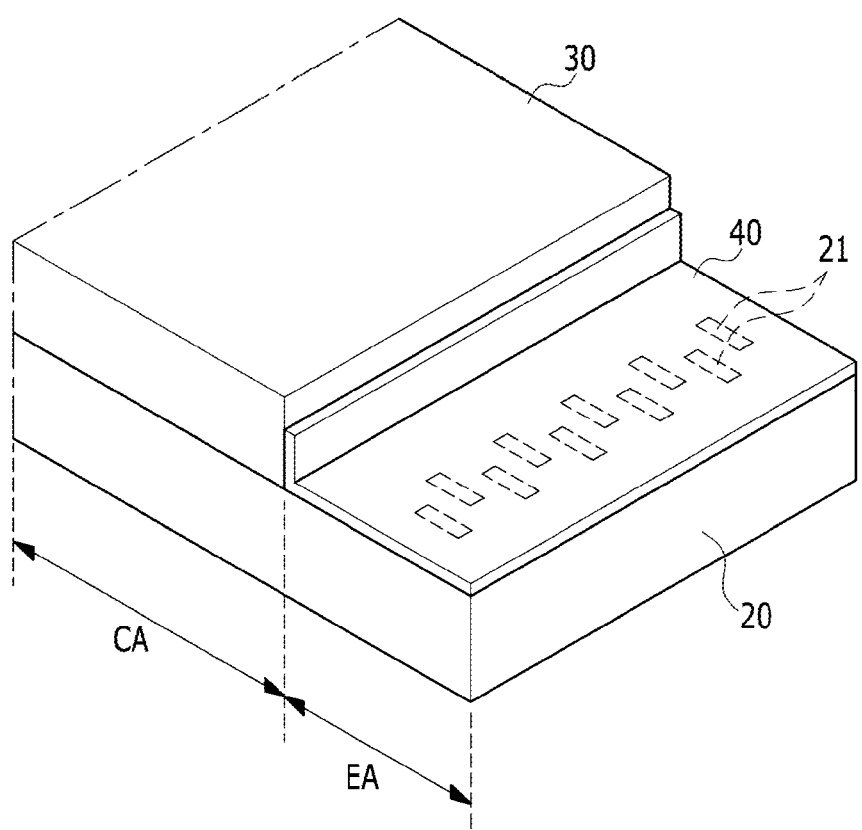
FIG. 5 is a schematic perspective view illustrating a structure in which a first passivation layer is coated on an exposure area of a division panel according to a first exemplary embodiment.

FIG. 5 is a schematic perspective view illustrating a structure in which a first passivation layer is coated on an exposure area of a division panel according to a first exemplary embodiment.

In the coating of the first passivation layer (S14), a first passivation layer 40 is coated so that the exposure area (EA) of the first division panel 20 is wholly covered and protected.

In the subsequent chemical reinforcing step (S16), the first passivation layer 40 is formed of a material that is not etched or etched less than portions on which the first passivation layer 40 is not coated, even though etchant contacts the material.

Accordingly, the pad electrodes 21 disposed on the exposure area (EA) may be protected from being damaged by the etchant in the subsequent chemical reinforcing step etchant.

As shown in FIG. 5, the first passivation layer 40 may extend to partially cover an end portion the second division panel 30 adjacent to the exposure area (EA). Accordingly, since the first passivation layer 40 may cover and protect a portion at which the first division panel 20 and the second division panel 30 are bonded, the thin film transistor array layer, the color filter layer, the electrode layer, and the like that are disposed inside the division panel may be protected from being damaged by the etchant in the subsequent chemical reinforcing step.

Further, although not illustrated in FIG. 5, the first passivation layer 40 may be formed to cover the entire second division panel 30 adjacent to the exposure area (EA), or it may be formed to further partially cover an upper surface of the second division panel 30. As such, since the first passivation layer 40 may extend to cover some or all of the second division panel 30, when the display device of the present exemplary embodiment is a liquid crystal display, the etchant is prevented from flowing between the first division panel 20 and the second division panel 30 in which the liquid crystal is injected.

The first passivation layer 40 may be formed of metal oxide, carbide, silicon nitride, silicon oxynitride, or the like. When the first passivation layer 40 is formed with metal oxide, it may include hafnium oxide, zirconium oxide, tantalum oxide, and aluminum oxide. When the first passivation layer 40 is formed with carbide, it may include an amorphous carbon layer (ACL).

The first passivation layer 40 may be coated by chemical vapor deposition (CVD) or physical vapor deposition (PVD), or it may be coated by applying ultraviolet rays (UV) or heat thereto to be hardened after coating a coating solvent on the division panel through a dipping method, a spraying method, a printing method, or the like.

However, the exemplary embodiment is not limited thereto, and a material and a coating method of the first passivation layer 40 may be variously applied according to physical properties of the material, relation with the etchant, relation with the subsequent process, and the like.

Figure 6:
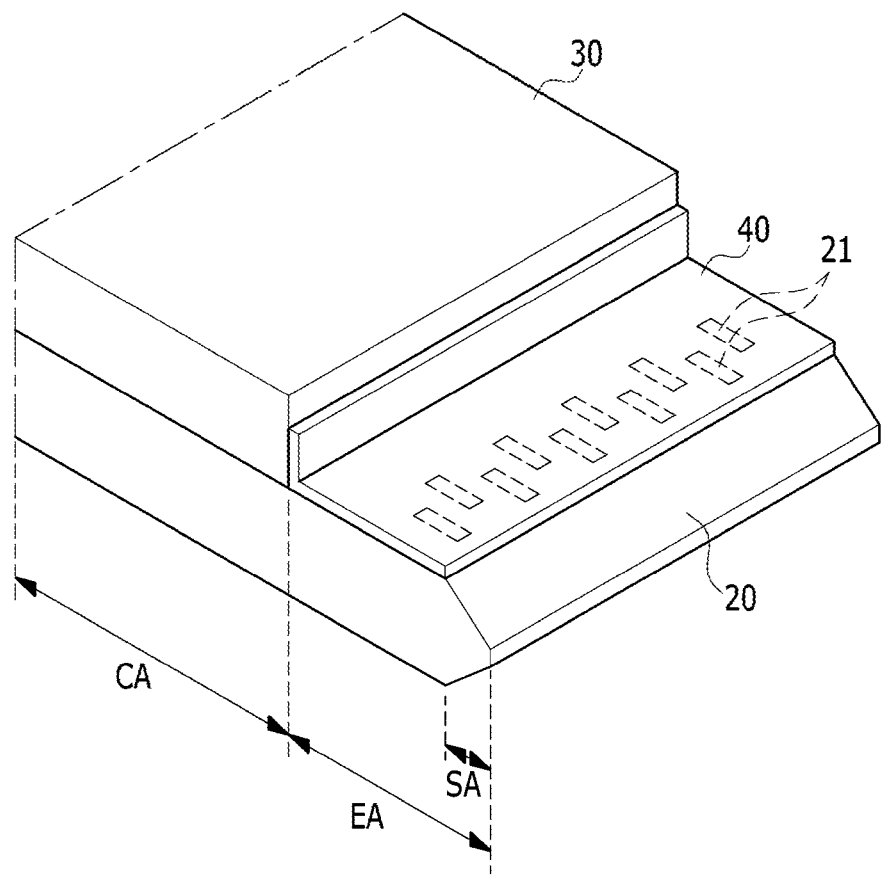
FIG. 6 is a schematic perspective view illustrating a first division panel of which an end portion is chamfered according to a first exemplary embodiment.

FIG. 6 is a schematic perspective view illustrating a first division panel of which an end portion is chamfered according to a first exemplary embodiment.

In the chamfering (S15), an upper edge and a lower edge of the end portion of the first division panel PN1 belonging to the exposure area (EA) may be chamfered, as shown in FIG. 6. The chamfering process may be performed by using a grinding wheel.

In the first exemplary embodiment, the area in which the chamfering process is performed is differentiated as a chamfer area (SA), as shown in FIG. 6. That is, the chamfer area (SA) is part of the exposure area (EA), and it is an outermost end area of the first division panel PN1 where the pad electrodes 21 are not formed.

Since the end portion of the first division panel 20 belonging to the exposure area (EA) is formed by cutting, an outermost edge belonging to the chamfer area (SA) may be non-uniformly formed. Accordingly, in the first exemplary embodiment, the outermost end portion of the first division panel PN1 of the chamfer area (SA) is smoothly ground through the chamfering process, as shown in FIG. 6.

In this case, a portion of the first passivation layer 40 covering the chamfer area (SA) may be removed by the chamfering process.

A chamfered shape of the first division panel PN1 belonging to the exposure area (EA) is not necessarily formed in the shape shown in FIG. 6, but it may be variously formed according to a non-uniform degree of an end shape of the first division panel PN1, in relation to the subsequent process, and the like.

In the chemical reinforcing step (S16), the chemical reinforcing process is performed by partially or wholly dipping the division panel completely chamfered in the etchant as shown in FIG. 6. In the first exemplary embodiment, at least the area (SA) chamfered through the chamfering (S15) is dipped in the etchant.

Accordingly, the micro-cracks occurring on the exposure area (EA) of the glass substrate of the first division panel PN1, as a result of the cutting of the bonded panel, may be removed. Furthermore, since a blunt portion is formed on the surface of the portion dipped in the etchant, stress applied to the inside of the glass substrate decreases, and strength, elongation, and the like of the glass substrate may be improved.

As such, since the chemical reinforcing process according to the first exemplary embodiment removes the micro-cracks of the incision surface and the chamfered portion of the glass substrate by uniformly etching the glass surface, it is referred to as a healing process.

In the first exemplary embodiment, the etchant may be made by mixing ammonium fluoride, inorganic acid, organic acid, and other salts in a hydrofluoric acid (HF) solution, which dissociates into H+ cations and F− anions in deionized water. When the glass substrate dipped in the etchant contacts the dissociated HF, it is melted and etched.

The ammonium fluoride controls the etching degree of the glass, thereby improving the shape of the blunt portion. That is, ammonium ions in the ammonium fluoride adhere to the glass surface and adjust the pH thereof. The ammonium fluoride serves as a buffer to adjust the rapid etching of the glass.

The inorganic acid adjusts the pH to appropriately increase or decrease the speed of forming the blunt portion of the glass. That is, if the pH decreases, the dissociation of the glass is promoted, and the speed of forming the blunt portion increases. Conversely, if the pH increases, the dissociation of the glass is suppressed, and the speed of forming the blunt portion decreases.

The inorganic acid may be one or more selected from a group consisting of sulfuric acid ($H_2SO_4$), hydrochloric acid (HCl), nitric acid ($HNO_3$), phosphoric acid ($H_3PO_4$), sulfamic acid ($SO_3HNH_2$), perchloric acid ($HClO_4$), chromic acid ($HCrO_4$), sulfurous acid ($H_2SO_3$), and nitrous acid ($HNO_2$).

The organic acid increases isotropy and increases the degree of melting the glass to improve the processing amount when the blunt portion of the glass is formed. That is, the organic acid isotropically etches the glass to allow a uniform semicircular blunt portion to be formed. Further, the organic acid may increase the degree of melting the glass to chemically reinforce more glass in the same amount of time.

The organic acid may be one or more selected from a group consisting of carboxylic acid, dicarboxylic acid, tricarboxylic acid, and tetracarboxylic acid.

However, the exemplary embodiment is not limited thereto, and the kind and composition ratio of the HF, the acids, and the other salts in the etchant may be variously designed according to the chemical reinforcing process time, the kind of the glass substrate, and the like.

Figure 7A:
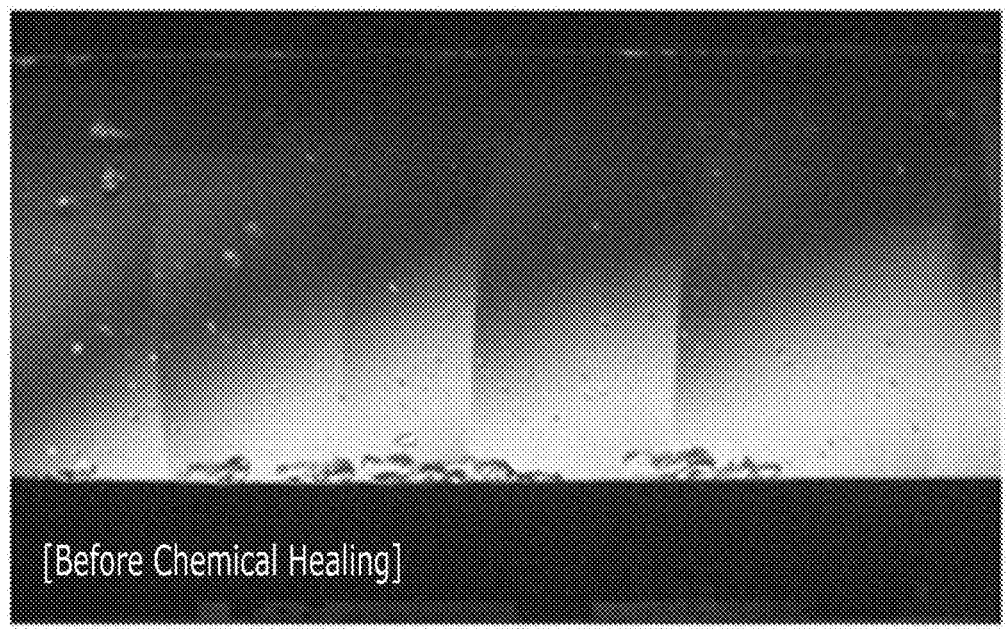
FIGS. 7A and 7B illustrate a micro-structure change of a surface of a glass substrate due to chemical reinforcing during a manufacturing method of a display device according to a first exemplary embodiment. In particular.
Figure 7B:
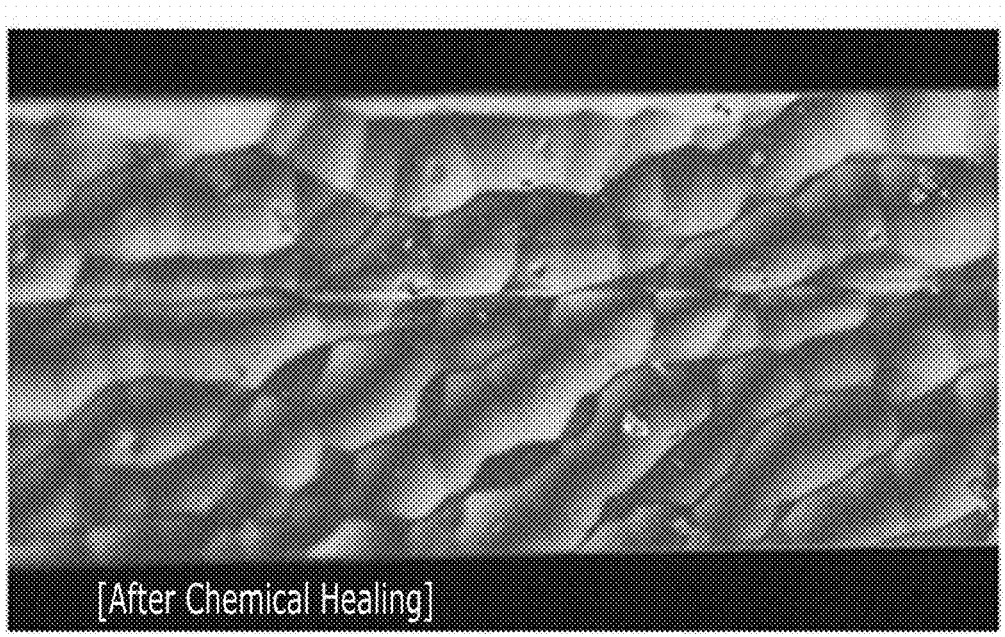

FIGS. 7A and 7B illustrate the micro-structure change of a surface of a glass substrate due to chemical reinforcing during the manufacturing method of the display device according to a first exemplary embodiment. In particular, while FIG. 7A illustrates a micro-structure of the surface of the glass substrate surface before the chemical reinforcing, and FIG. 7B illustrates a micro-structure of the surface of the glass substrate surface after the chemical reinforcing.

Referring to FIG. 7A and FIG. 7B, although a surface of the glass substrate before the chemical reinforcing process has a typical structure as shown in FIG. 7A, the glass substrate after the chemical reinforcing process has a surface in which a plurality of blunt portions are formed as shown in FIG. 7B.

As such, the manufacturing method of the display device according to the first exemplary embodiment, unlike a typical manufacturing method of the display device, may etch the surface of the glass substrate through the chemical reinforcing process so that the surface of the glass substrate has a minute structure including a plurality of blunt portions and may improve physical properties, such as bending stress, elongation, and the like, of the division panel by controlling the formation of the blunt portions, thereby manufacturing a display device having excellent durability and reliability.

When the chemical reinforcing process is completed, and after separating the first passivation layer 40 remaining in the exposure area (EA) and cleaning the bonded substrate, the display device may be manufactured through a subsequent module process. For example, if the display device is a liquid crystal display, the display device may be manufactured by mounting a polarizer, a tape automated bonding (TAB) IC, and a driver thereon, and assembling a backlight unit (BLU) through subsequent processes.

Figure 8:
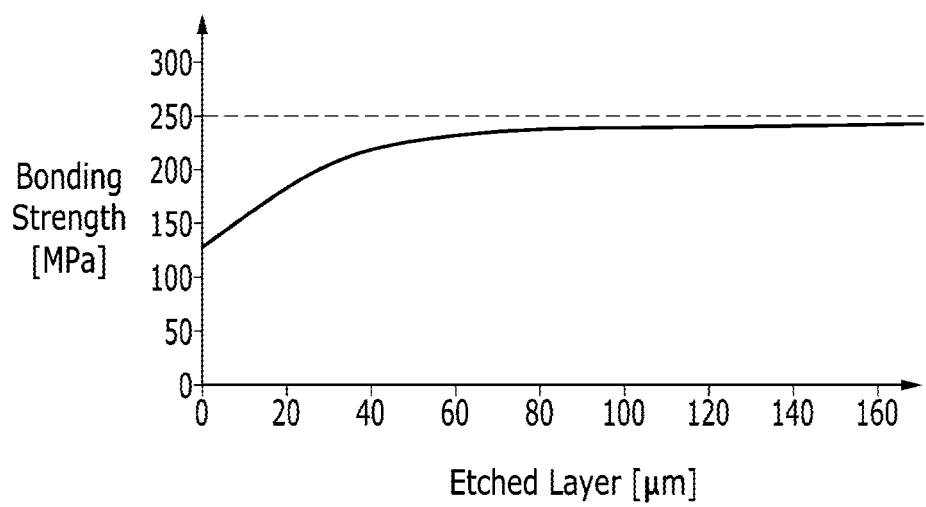
FIG. 8 is a graph illustrating a change of bend strength depending on a degree of chemical reinforcing by a manufacturing method of a display device according to a first exemplary embodiment.

FIG. 8 is a graph illustrating a change of bend strength depending on a degree of chemical reinforcing for a bonded panel of 15 inches by a manufacturing method of a display device according to a first exemplary embodiment.

After the bonded panel is dipped in the etchant, the change of bend strength thereof according to the degree of the etching is representatively shown in FIG. 8. Until the surface of the glass substrate is etched to about 50 micrometers by the etchant, the bend strength greatly increases, but when the surface of the glass substrate is etched more than about 50 micrometers, the bend strength tends to converge at a predetermined bend strength.

That is, it can be seen that the surface of the glass substrate is gradually melted and etched by the etchant to a depth of about 50 micrometers from the surface of the glass substrate such that micro-cracks in the surface are gradually removed, thereby decreasing the inner stress of the glass substrate and increasing the bend strength.

Further, it can be seen that when the surface of the glass substrate is etched more than about 50 micrometers from the surface thereof, the bend strength of the glass substrate converges to correspond to an inherent strength of the glass substrate because the etching is being performed deeper than the depth at which the micro-cracks are formed.

As such, the manufacturing method of the display device according to the first exemplary embodiment restores the physical properties of the bonded panel by adding the chemical reinforcing process to the manufacturing process of the display device, thereby manufacturing a display device having excellent durability and reliability.

Further, in the chemical reinforcing process, portions other than a portion in which the etching is performed are covered and protected by the first passivation layer, thereby improving the stability and reliability of the chemical reinforcing process.

A manufacturing method of a display device according to a second exemplary embodiment is described with reference to FIGS. 9 and 10. In describing the second exemplary embodiment, a detailed description of the same configuration and manufacturing method as in the above-described first exemplary embodiment is omitted.

Figure 9:
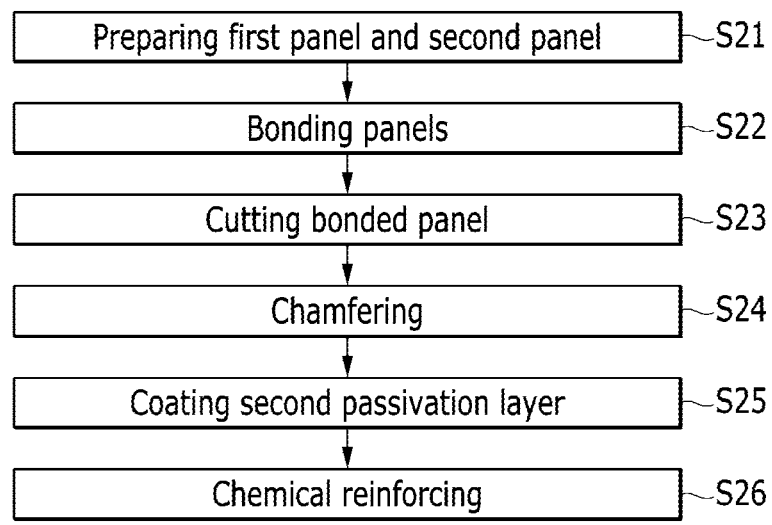
FIG. 9 is a flowchart of a manufacturing method of a display device according to a second exemplary embodiment.

FIG. 9 is a flowchart of a manufacturing method of a display device according to a second exemplary embodiment.

Referring to FIG. 9, a manufacturing method of a display device according to the second exemplary embodiment includes preparing a first panel and a second panel (S21); bonding the first panel and the second panel (S22); cutting the bonded panel (S23); chamfering the cut panel (S24); coating a second passivation layer (S25); and chemical reinforcing the cut panel coated with second passivation layer (S26). The second exemplary embodiment does not include the coating of the first passivation layer (S14) of the first exemplary embodiment, which is performed before the chamfering in the method of FIG. 1 but instead includes the coating of the second passivation layer (S25) after the chamfering (S24).

Figure 10:
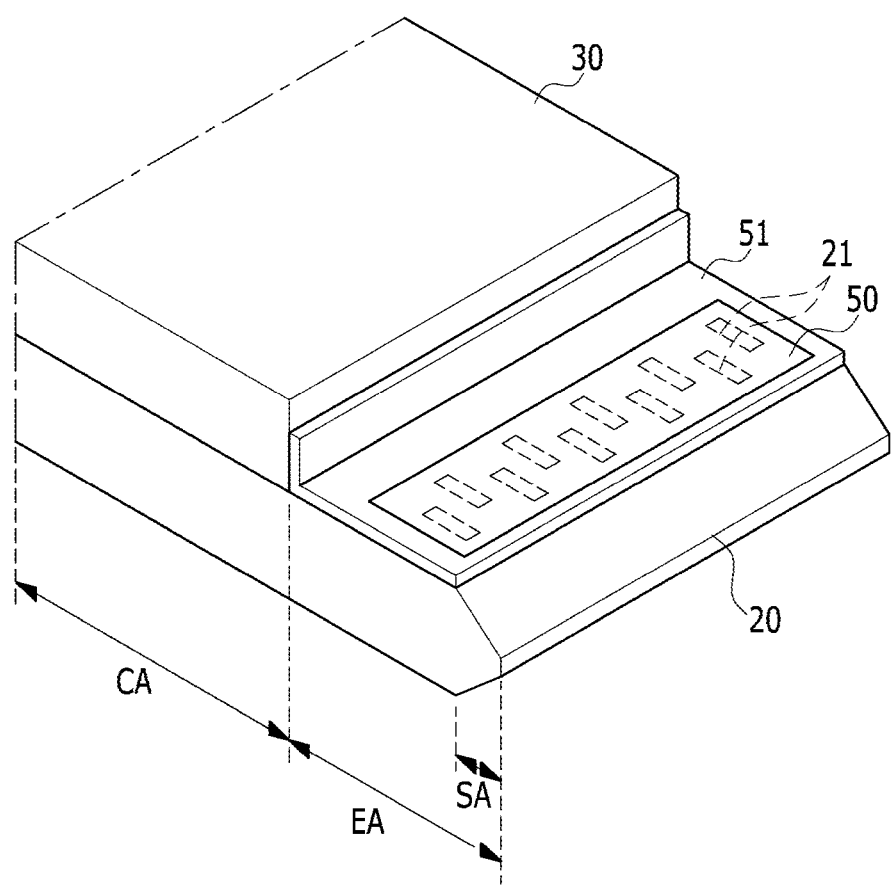
FIG. 10 is a schematic perspective view illustrating a structure in which a second passivation layer is coated on an exposure area of a division panel according to a second exemplary embodiment.

FIG. 10 is a schematic perspective view illustrating a structure in which a second passivation layer is coated on an exposure area of a division panel according to a second exemplary embodiment.

In the coating of the second passivation layer (S25), the second passivation layer 50 is coated on the exposure area (EA) except for the chamfer area (SA), as shown in FIG. 10. After the chamfering of the chamfer area (SA) is completed, the second passivation layer 50 covers and protects all of the pad electrodes 21 in the exposure area (EA). Accordingly, in the subsequent chemical reinforcing step (S26), the pad electrodes 21 may be protected from damage by the etchant.

The second passivation layer 50 may be formed of a silicon nitride, a silicon oxynitride, a high-molecular polymer, or the like. When the second passivation layer 50 is formed of a high-molecular polymer, it may include a polyethylene (PE), polypropylene (PP), or the like, and it may be formed to have a tape shape to be easily detachable.

Referring to FIG. 10, the second passivation layer 50 may coat only the exposure area (EA) overlapping the pad electrodes and not coat the remaining area other than the pad electrodes 21 of the exposure area (EA). Accordingly, in the second exemplary embodiment, a reinforcement layer 51 is further coated on the remaining area of the exposure area (EA) in which the second passivation layer 50 is not coated and coated on at least a portion of an end portion of the second division panel 30 adjacent to the exposure area (EA).

The reinforcement layer 51 may also be formed of a silicon nitride, a silicon oxynitride, a high-molecular polymer, or the like as in the second passivation layer 50. When the reinforcement layer 51 is formed of a high-molecular polymer, it may include an epoxy material, and after the chemical reinforcing process is completed, when the reinforcement layer 51 is cleaned by a cleaning solution at about 60° C. as a subsequent process, the second passivation layer 50 and the reinforcement layer 51 may be easily separated from the first division panel 20.

As such, the manufacturing method of the display device according to the second exemplary embodiment may prevent unexpected damage to the pad electrodes 21, the thin film transistor array layer, the plurality of electrode layers, the color filter layer, and the like during the chemical process even though the second passivation layer 50 and the reinforcement layer 51 of the epoxy material are coated after the chemical chamfering, and the second passivation layer 50 and the reinforcement layer 51 may be easily separated after the chemical process is finished.

A manufacturing method of a display device according to a third exemplary embodiment is now described with reference to FIG. 11. In describing the third exemplary embodiment, a detailed description of the same configuration and manufacturing method as in the first exemplary embodiment is omitted.

Figure 11:
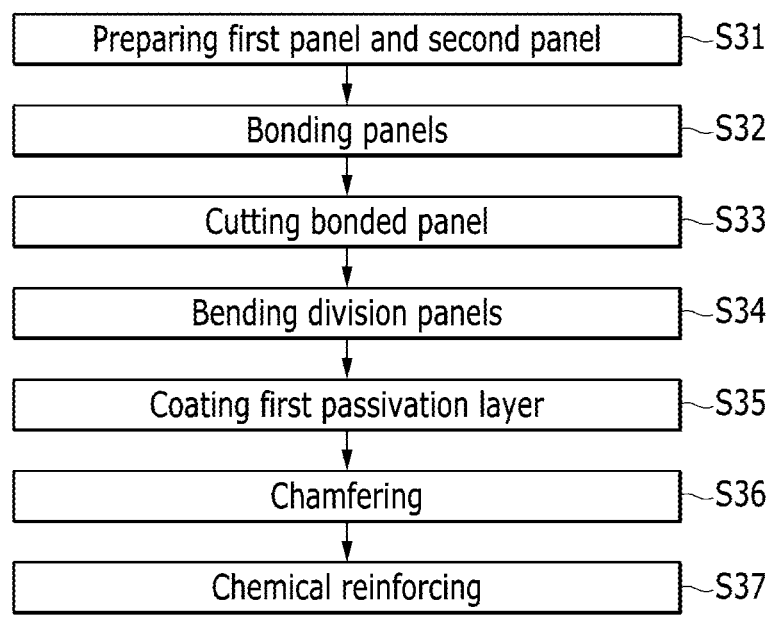
FIG. 11 is a flowchart of a manufacturing method of a display device according to a third exemplary embodiment.

FIG. 11 is a flowchart of the manufacturing method of the display device according to the third exemplary embodiment.

Referring to FIG. 11, the manufacturing method of the display device according to the third exemplary embodiment includes preparing a first panel and a second panel (S31); bonding the first and second panels (S32), cutting the bonded panel to be division panels (S33), bending the division panels (S34), coating a first passivation layer on the division panels (S35), chamfering the coated panels with the first passivation layer (S36), and chemical reinforcing the chamfered panels (S37). In the third exemplary embodiment, the bending of the division panels (S34) is added before the coating of the first passivation layer of the first exemplary embodiment.

In bending the division panels (S34), a plurality of division panels each divided into a cell unit are respectively bent to have a predetermined curvature. In the bending of the division panels (S34), the division panels are curved after fixing opposite sides of the division panels with a jig and the like. Accordingly, the first division panel 20 and the second division panel 30 may be bent so as to have the same curvature by a single bending process.

In the bending of the division panel (S34), although a plurality of micro-cracks may occur in the surface of the bent division panel surface due to the bending, the plurality of micro-cracks may be removed or be reduced by the subsequent chemical reinforcing step (S37), so that the display device that has improved bend strength, elongation, and the like may be manufactured.

Further, in the third exemplary embodiment, the division panels are respectively bent after the bonded panel is cut into cell units to be the division panels, but the exemplary embodiment is not limited thereto. For example, the first panel PN1 and the second panel PN2 may be bent to have the same curvature while preparing the first panel PN1 and the second panel PN2 that have the same size as the mother panel. Alternatively, after the first panel PN1 and the second panel PN2 that have the same size as the mother panel are bonded, the bonded panel may be bent to have a predetermined curvature. Thus, the curved display device may be variously manufactured.

As such, according to the manufacturing method of the display device of the third exemplary embodiment, even when the curved display device is manufactured by using the bent division panel, the micro-cracks occurring during the cutting of the bonded panels and the curved bending of the division panels may be removed or be reduced through the subsequent chemical reinforcing process, thereby providing the display device with excellent durability and reliability.

While this disclosure has been described in connection with exemplary embodiments, it is to be understood that the described technology is not limited to the disclosed embodiments. On the contrary, the described technology is intended to cover various modifications and equivalent arrangements included within the spirit and scope of the appended claims.

What is claimed is:

1. A manufacturing method of a display device, comprising:
   preparing a first panel and a second panel that are respectively provided with one or more pattern layers formed on a substrate;
   bonding the first panel and the second panel;
   cutting the bonded panel into division panels of a cell unit, each division panel including a first division panel, which is a portion of the first panel, still bonded to a second division panel, which is a portion of the second panel;
   chamfering the division panels; and
   chemically reinforcing the chamfered division panels, wherein
   the first division panel includes a cover area that is covered by the second division panel and an exposure area other than the covered area.

2. The manufacturing method of the display device of claim 1, wherein
   pad electrodes are formed on an upper portion of the first division panel belonging to the exposure area.

3. The manufacturing method of the display device of claim 1, further comprising
   coating a first passivation layer to cover the exposure area of the first division panel before the chamfering.

4. The manufacturing method of the display device of claim 3, wherein
   the first passivation layer, in the coating of the first passivation layer, extends to cover at least portion of the second division panel adjacent to the exposure area.

5. The manufacturing method of the display device of claim 1, wherein
   an end portion of the first division panel belonging to the exposure area, in the chamfering, is chamfered.

6. The manufacturing method of the display device of claim 5, further comprising
   coating a second passivation layer on portions other than the chamfered portion of the first division panel belonging to the exposure area before the chemical reinforcing.

7. The manufacturing method of the display device of claim 1, wherein
   the chemical reinforcing includes a healing process of dipping the division panel in an etchant to be chemically reinforced.

8. A manufacturing method of a display device, comprising:
   preparing a first panel and a second panel that are respectively provided with one or more pattern layers formed on a substrate;
   bonding the first panel and the second panel;
   cutting the bonded panel into division panels of a cell unit;
   chamfering the division panels; and
   chemically reinforcing the chamfered division panels, wherein the first panel and the second panel are bent to have the same curvature.

9. A manufacturing method of a display device, comprising:
   preparing a first panel and a second panel that are respectively provided with one or more pattern layers formed on a substrate;
   bonding the first panel and the second panel;
   cutting the bonded panel into division panels of a cell unit;
   chamfering the division panels; and
   chemically reinforcing the chamfered division panels, wherein the first division panel and the second division panel are bent to have the same curvature before the chamfering.

* * * * *